(12) United States Patent
Tsai et al.

(10) Patent No.: US 8,709,930 B2
(45) Date of Patent: Apr. 29, 2014

(54) SEMICONDUCTOR PROCESS

(75) Inventors: Zen-Jay Tsai, Tainan (TW); Shao-Hua Hsu, Taoyuan County (TW); Chi-Horn Pai, Tainan (TW); Ying-Hung Chou, Tainan (TW); Shih-Hao Su, Kaohsiung (TW); Shih-Chieh Hsu, New Taipei (TW); Chih-Ho Wang, Tainan (TW); Hung-Yi Wu, Keelung (TW); Shui-Yen Lu, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 147 days.

(21) Appl. No.: 13/304,416

(22) Filed: Nov. 25, 2011

(65) Prior Publication Data

US 2013/0137256 A1    May 30, 2013

(51) Int. Cl.
*H01L 21/3205*    (2006.01)

(52) U.S. Cl.
USPC .......................................... 438/586

(58) Field of Classification Search
USPC ................................. 438/585, 586
See application file for complete search history.

(56) References Cited

U.S. PATENT DOCUMENTS

| | | |
|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |
| 5,960,322 A | 9/1999 | Xiang |
| 6,030,874 A | 2/2000 | Grider |
| 6,033,963 A | 3/2000 | Huang |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |

(Continued)

*Primary Examiner* — Bradley K Smith
(74) *Attorney, Agent, or Firm* — Winston Hsu; Scott Margo

(57) ABSTRACT

A semiconductor process is provided. The prior steps include: a first gate including a first cap layer and a second gate including a second cap layer are formed on a substrate. A hard mask layer is formed to cover the first gate and the second gate. The material of the hard mask layer is different from the material of the first cap layer and the second cap layer. The hard mask layer is removed entirely after a lithography process and an etching process are performed. The following steps include: a material is formed to entirely cover the first gate and the second gate. The material, the first gate and the second gate are etched back to make the first gate and the second gate have the same level and expose layers in both of them.

19 Claims, 18 Drawing Sheets

(56) References Cited

U.S. PATENT DOCUMENTS

| | | |
|---|---|---|
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,653,698 B2 | 11/2003 | Lee |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,483 B2 | 2/2005 | Doczy |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,921,711 B2 | 7/2005 | Cabral, Jr. |
| 6,930,007 B2 | 8/2005 | Bu |
| 6,946,350 B2 | 9/2005 | Lindert |
| 6,953,719 B2 | 10/2005 | Doczy |
| 6,962,856 B2 | 11/2005 | Park |
| 6,967,131 B2 | 11/2005 | Saenger |
| 6,972,225 B2 | 12/2005 | Doczy |
| 6,972,461 B1 | 12/2005 | Chen |
| 6,991,979 B2 | 1/2006 | Ajmera |
| 6,991,991 B2 | 1/2006 | Cheng |
| 7,029,966 B2 | 4/2006 | Amos |
| 7,037,773 B2 | 5/2006 | Wang |
| 7,056,794 B2 | 6/2006 | Ku |
| 7,060,576 B2 | 6/2006 | Lindert |
| 7,060,579 B2 | 6/2006 | Chidambaram |
| 7,064,050 B2 | 6/2006 | Cabral, Jr. |
| 7,064,066 B1 | 6/2006 | Metz |
| 7,074,680 B2 | 7/2006 | Doczy |
| 7,112,495 B2 | 9/2006 | Ko |
| 7,112,851 B2 | 9/2006 | Saenger |
| 7,118,952 B2 | 10/2006 | Chen |
| 7,126,199 B2 | 10/2006 | Doczy |
| 7,132,338 B2 | 11/2006 | Samoilov |
| 7,148,548 B2 | 12/2006 | Doczy |
| 7,153,734 B2 | 12/2006 | Brask |
| 7,157,378 B2 | 1/2007 | Brask |
| 7,169,675 B2 | 1/2007 | Tan |
| 7,183,184 B2 | 2/2007 | Doczy |
| 7,183,596 B2 | 2/2007 | Wu |
| 7,202,124 B2 | 4/2007 | Fitzgerald |
| 7,217,627 B2 | 5/2007 | Kim |
| 7,220,635 B2 | 5/2007 | Brask |
| 7,288,822 B1 | 10/2007 | Ting |
| 7,303,999 B1 | 12/2007 | Sriraman |
| 7,316,949 B2 | 1/2008 | Doczy |
| 7,317,231 B2 | 1/2008 | Metz |
| 7,326,610 B2 | 2/2008 | Amos |
| 7,335,959 B2 | 2/2008 | Curello |
| 7,355,281 B2 | 4/2008 | Brask |
| 7,390,709 B2 | 6/2008 | Doczy |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,622,344 B2 | 11/2009 | Liang |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0128783 A1 | 6/2007 | Ting |
| 2007/0166929 A1 | 7/2007 | Matsumoto |
| 2007/0262396 A1 | 11/2007 | Zhu |
| 2007/0262451 A1 | 11/2007 | Rachmady |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0039433 A1 | 2/2009 | Yang |
| 2009/0045456 A1 | 2/2009 | Chen |
| 2009/0057769 A1 | 3/2009 | Wei |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0184402 A1 | 7/2009 | Chen |
| 2009/0186458 A1 | 7/2009 | Yu |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0052066 A1 | 3/2010 | Yu |
| 2010/0065926 A1 | 3/2010 | Yeh |
| 2010/0068877 A1 | 3/2010 | Yeh |
| 2010/0093147 A1 | 4/2010 | Liao |
| 2012/0012938 A1* | 1/2012 | Chen et al. .................... 257/369 |
| 2012/0153398 A1* | 6/2012 | Baars et al. .................... 257/369 |

\* cited by examiner

SEMICONDUCTOR PROCESS

BACKGROUND OF THE INVENTION

1. Field of the Invention

The present invention relates to a semiconductor process, and more particularly, to a semiconductor process, which forms a cap layer with a material different from a hard mask layer, covers two gates with a material layer, and back etches the material and the gates to make the two gates have the same height.

2. Description of the Prior Art

For decades, chip manufacturers have developed more and more small metal-oxide-semiconductor (MOS) transistors to make them faster. As the semiconductor processes advance to very deep sub micron era, such as 65-nm node or beyond, increasing the driving current for MOS transistors has become a critical issue. In order to improve device performance, crystal strain technology has been developed. Crystal strain technology has become more and more attractive as a mean for obtaining better performances in the field of CMOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel.

An epitaxial layer is often formed in a substrate beside a gate for putting a strain on a semiconductor crystal. In a first step for forming the epitaxial layer, a first spacer is formed to define the position of the epitaxial layer, then the substrate is etched to form a recess, and the epitaxial layer is formed in the recess. After the epitaxial layer is formed, the first spacer needs to be removed to form a second spacer, which defines the position of a source/drain in the substrate beside the gate.

For a complementary metal-oxide semiconductor (CMOS) or a static random access memory (SRAM), an NMOS transistor and a PMOS transistor are located on both sides, and the materials and the forming methods of the epitaxial layers of the NMOS transistor and the PMOS transistor are different. For example, a silicon germanium is suited for forming in the substrate beside a gate of the PMOS transistor but the silicon germanium is not suited for forming in the substrate beside a gate of the NMOS transistor. Furthermore, a silicon carbide is suited for forming in the substrate beside a gate of the NMOS transistor. As the silicon germanium is formed in the substrate beside the gate of the PMOS transistor, a lithography process is performed on the PMOS transistor to form a first spacer and a recess, and the first spacer is removed after the epitaxial layer is formed. The cap layer of the PMOS transistor is etched during the step of forming the silicon germanium epitaxial layer, without the cap layer of the NMOS transistor being etched. Therefore, thicknesses of the gates of the NMOS transistor and the PMOS transistor are different. Moreover, if the cap layer of the PMOS transistor is over-etched, the gate layer below the cap layer may be exposed, or the first spacer may not be removed completely.

The modern methods of solving the problem of the thickness difference between the gate of the NMOS transistor and the gate of the PMOS transistor in a static random access memory (SRAM) may be described as following. A lithography process is additionally performed to thin the cap layer of the NMOS transistor, but the thinning process is complex and the photoresists formed during the two lithography processes (respectively performed on the PMOS transistor and the NMOS transistor) would induce misalignment at the boundary between the NMOS transistor and the PMOS transistor, resulting in the cap layer at the boundary being over-etched or not enough etched, hence degrading the performance of the static random access memory (SRAM).

Therefore, a semiconductor process is especially needed in modern industries to solve problems such as thickness difference between gates of two transistors, spacer residues, and exposed gate layers.

SUMMARY OF THE INVENTION

The present invention provides a semiconductor process, which forms a cap layer made of a material different from the material of a hard mask layer so that the hard mask layer can be removed entirely in processes, covers two gates with a material layer, and etches back the material layer so that the two gates have the same height.

The present invention provides a semiconductor process including the following steps. A first gate and a second gate are formed on a substrate, wherein the first gate includes a first gate layer located on the substrate with a first cap layer located on the first gate layer, and a second gate includes a second gate layer located on the substrate with a second cap layer located on the second gate layer. A hard mask layer is formed to cover the first gate and the second gate. The material of the hard mask layer is different from the materials of the first cap layer and the second cap layer. A lithography process is performed to pattern the hard mask layer on the second gate to form a first spacer beside the second gate, and form a recess in the substrate beside the first spacer. An epitaxial layer is formed in the recess. An etching process is performed to entirely remove the hard mask layer remaining and the first spacer. A second spacer is then formed beside the first gate and the second gate respectively.

The present invention provides a semiconductor process including the following steps. A substrate having a first gate and a second gate is provided, wherein the first gate comprises a first gate layer located on the substrate, a first nitride layer located on the first gate layer and a first oxide layer located on the first nitride layer, and the second gate comprises a second gate layer located on the substrate and a second nitride layer located on the second gate layer. A material layer is formed to entirely cover the first gate and the second gate. The material layer, the first gate and the second gate are etched until the first nitride layer and the second nitride layer are exposed.

The present invention provides a semiconductor process, which forms the cap layer with a material different from the material of the hard mask layer, so that the hard mask layer can be removed entirely without the cap layer being over-etched and the gate layer below the cap layer being exposed. Moreover, the plurality of the cap layers of the gates having different thicknesses can be removed uniformly in the present invention by the method of forming and etching the material layer. Therefore the gates can have the same thicknesses, and the interdielectric layer and the contact etch stop layer can be planarized uniformly by a planarization process until the gate layers are exposed.

These and other objectives of the present invention will no doubt become obvious to those of ordinary skill in the art after reading the following detailed description of the preferred embodiment that is illustrated in the various figures and drawings.

DETAILED DESCRIPTION

FIGS. 1-13 schematically depict a cross-sectional view of a semiconductor process according to one embodiment of the present invention. A substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 such as a shallow trench isolation structure formed by a shallow trench isolation technology is formed in the substrate 110. A dielectric layer 120' is formed on the substrate 110. In an embodiment of applying a gate last for high-k last process, the dielectric layer 120' may be an oxide layer; in another embodiment of applying a gate last for high-k first process, the dielectric layer 120' may be a dielectric layer having a high dielectric constant. The dielectric layer having a high dielectric constant may be a metal containing dielectric layer, like a hafnium oxide layer or a zirconium oxide layer etc. Furthermore, the dielectric layer having a high dielectric constant may comprise hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1-xO_3$, PZT) or barium strontium titanate ($Ba_xSr_1-xTiO_3$, BST), but it is not limited thereto. A buffer layer (not shown) may be selectively formed between the dielectric layer 120' and the substrate 110.

A gate layer 130' is formed on the substrate 110. In this embodiment, the gate layer 130' is a sacrificial gate layer, which may be replaced with a metal gate in following processes, but it is not limited thereto. The sacrificial gate layer may be a polysilicon layer. A cap layer 142' may be selectively formed on the gate layer 130', and a cap layer 144' is formed on the cap layer 142'. There are two cap layers 142', 144' in this embodiment but the cap layer may be a single layer or a multilayer in another embodiment, depending on the needs. In this case, the cap layer 142' is a nitride layer and the cap layer 144' is an oxide layer.

Figure 1:
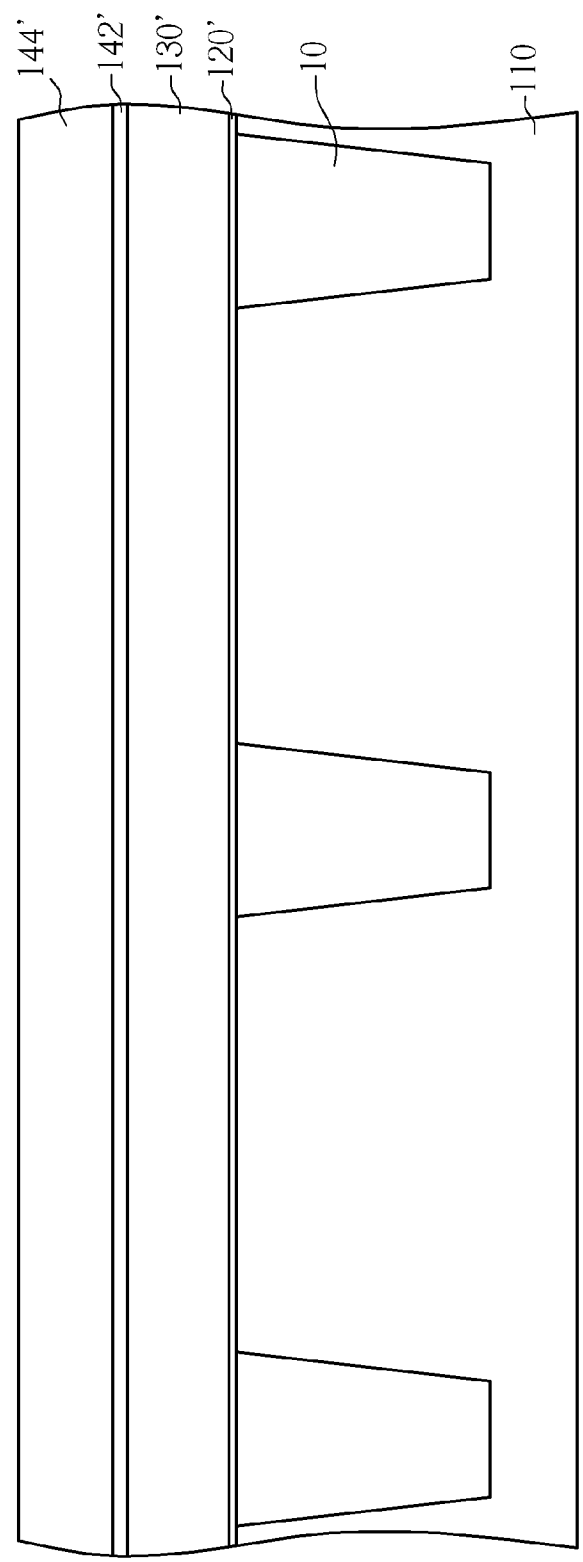
FIGS. 1-13 schematically depict a cross-sectional view of a semiconductor process according to one embodiment of the present invention.
Figure 2:
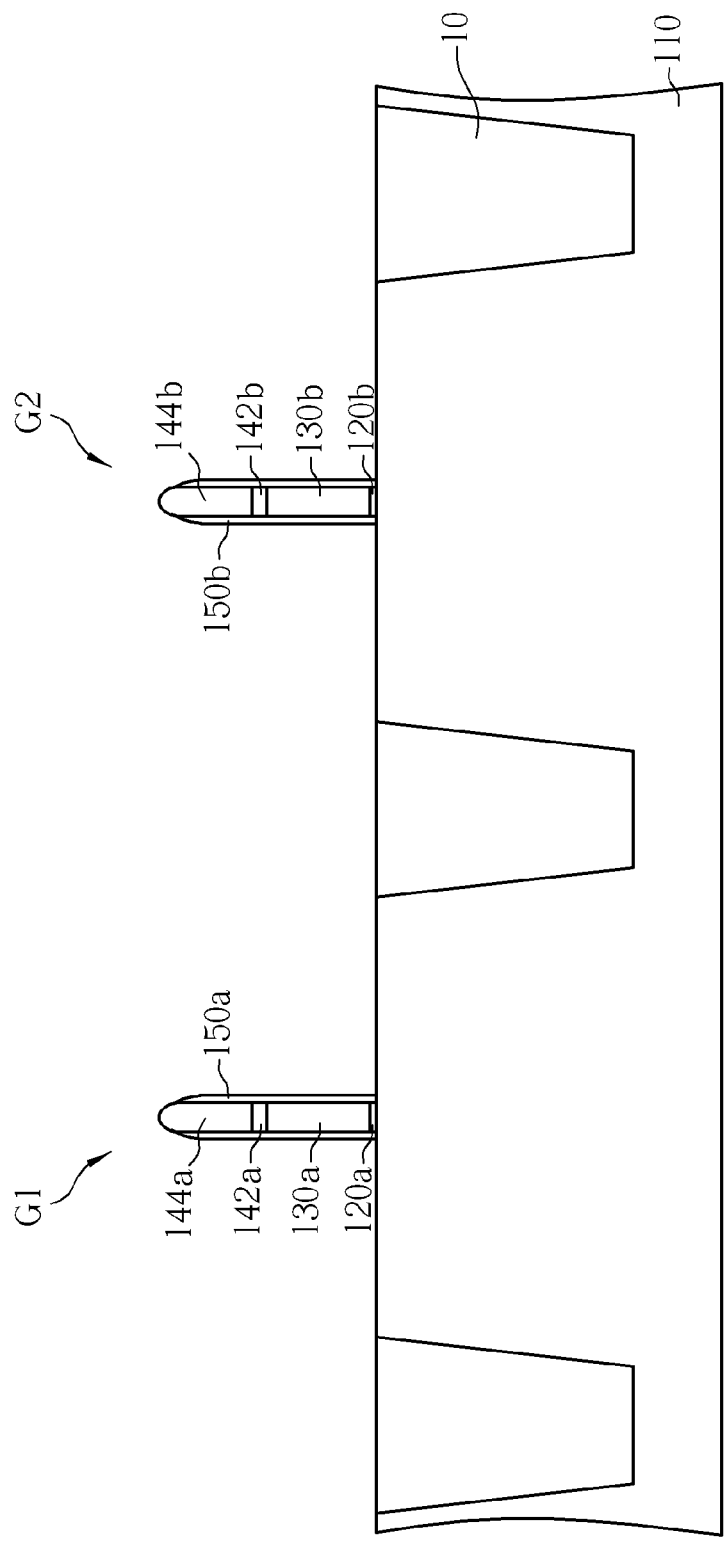

As shown in FIG. 2, the cap layer 144', the cap layer 142', the gate layer 130' and the dielectric layer 120' are sequentially patterned to form a first gate G1 and a second gate G2 on the substrate 110. Thus, the first gate G1 includes a first dielectric layer 120a and a first gate layer 130a stacked on the substrate 110, and a first cap layer 144a located on the first gate layer 130a; the second gate G2 includes a second dielectric layer 120b and a second gate layer 130b stacked on the substrate 110, and a second cap layer 144b located on the second gate layer 130b. In this embodiment, the first gate G1 may further include a third cap layer 142a located between the first gate layer 130a and the first cap layer 144a, and the second gate G2 may further include a fourth cap layer 142b located between the second gate layer 130b and the second cap layer 144b. In this case, the first cap layer 144a is a first oxide layer and the second cap layer 144b is a second oxide layer; the third cap layer 142a is a first nitride layer and the fourth cap layer 142b is a second nitride layer, but they are not restricted thereto. Spacers 150a, 150b are respectively formed on the side of the first gate G1 and the second gate G2, wherein the spacer 150a, 150b may be formed by a thermal oxide process, a chemical oxide process, etc.

Figure 3:
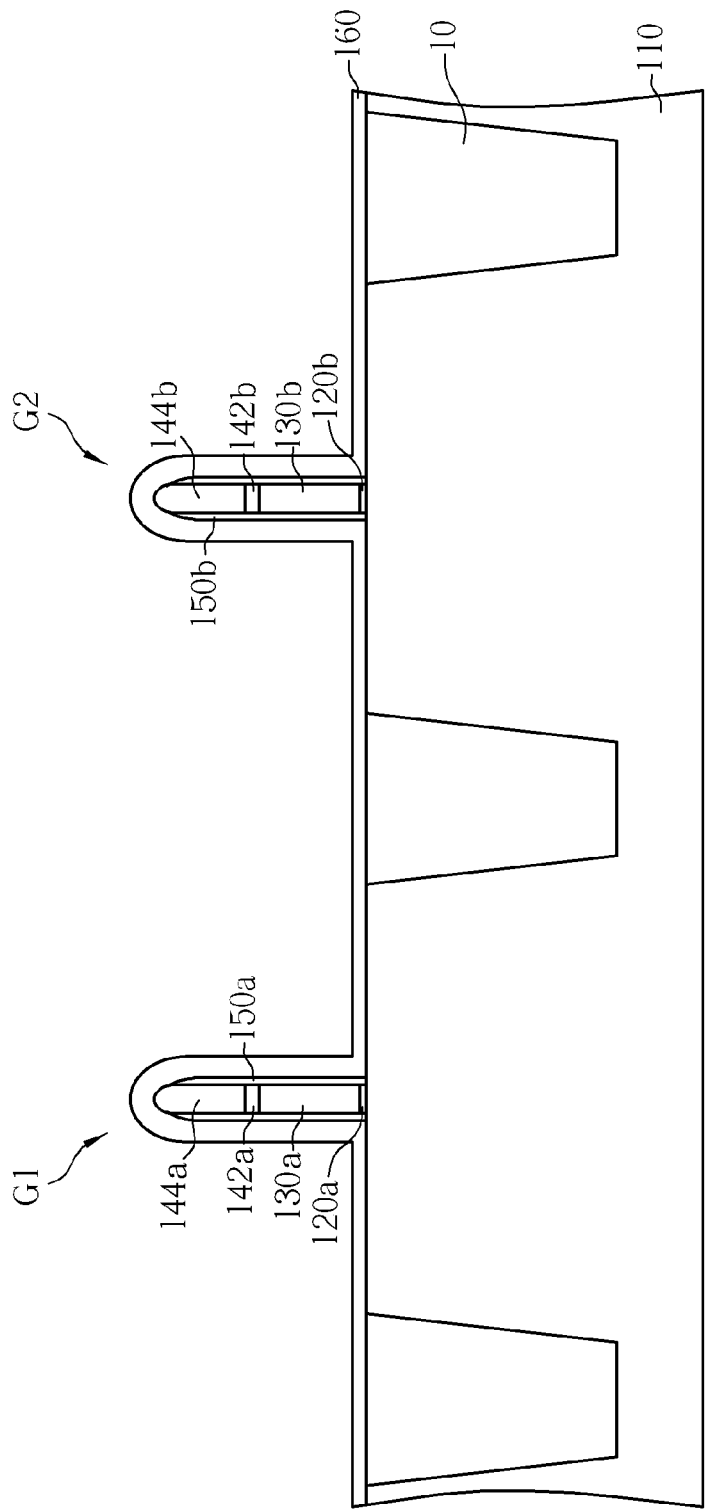

As shown in FIG. 3, a hard mask layer 160 is formed to cover the first gate G1 and the second gate G2, wherein the material of the hard mask layer 160 is different from the materials of the first cap layer 144a and the second cap layer 144b. In this case, the hard mask layer 160 is a silicon nitride layer having a different material from the first cap layer 144a and the second cap layer 144b. The material of the hard mask layer 160 is selected to be different from the materials of the first cap layer 144a and the second cap layer 144b, so that etching rates of a lithography process or an etching process performed in the following to the first cap layer 144a and the second cap layer 144b are different from to the hard mask layer 160, therefore the hard mask layer 160 can be removed entirely. The details will be described later.

Figure 4:
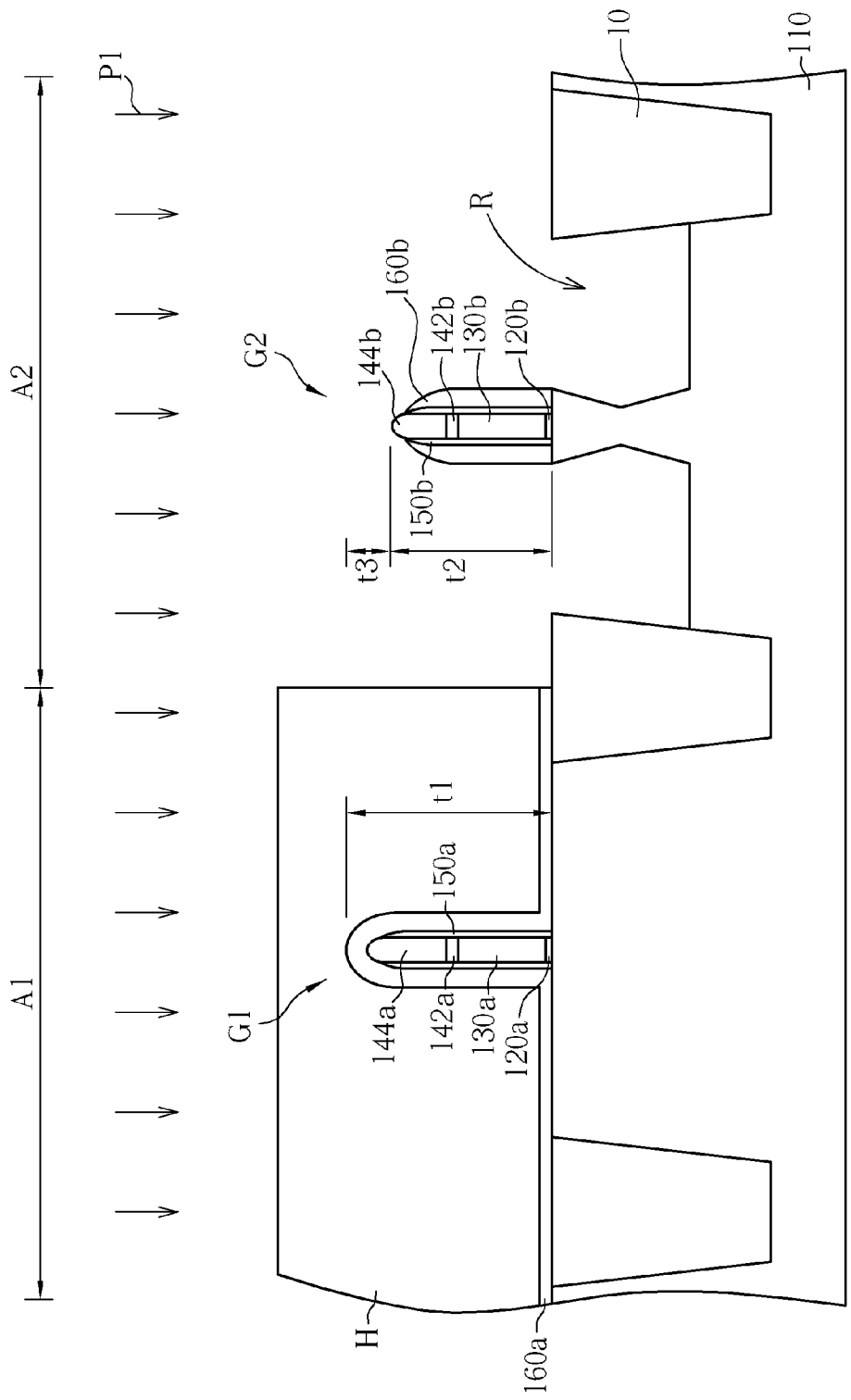

As shown in FIG. 4, a lithography process P1 is performed to pattern the hard mask layer 160 located on the second gate G2. For example, a photoresist layer (not shown) is covered and patterned to form a photoresist layer H, merely covering a first gate area A1 and exposing a second gate area A2. The hard mask layer 160 on the second gate G2 is patterned to form a first spacer 160b beside the second gate G2 and the hard mask layer 160a remains in the second gate area A2. At least a recess R is automatically aligned and formed in the substrate 110 beside the first spacer 160b by using the first spacer 160b as a hard mask.

The materials of the second cap layer 144b and the hard mask layer 160 selected in the present invention are different, such as materials having an etching rate of the lithography process P1 of the second cap layer 144b lower than that of the hard mask layer 160, in order to reduce the damage of the second cap layer 144b in the lithography process, and to form the first spacer 160b and the recess R completely. AS the lithography process P1 is performed, the hard mask layer 160 on the top of the second gate G2 is removed and the second gate G2 is exposed. In general, as the lithography process P1 is performed, the second gate G2 is partially etched, resulting in the thickness t1 of the first gate G1 being larger than the thickness t2 of the second gate G2, wherein the thickness difference of both can be named as a first thickness difference t3.

Figure 5:
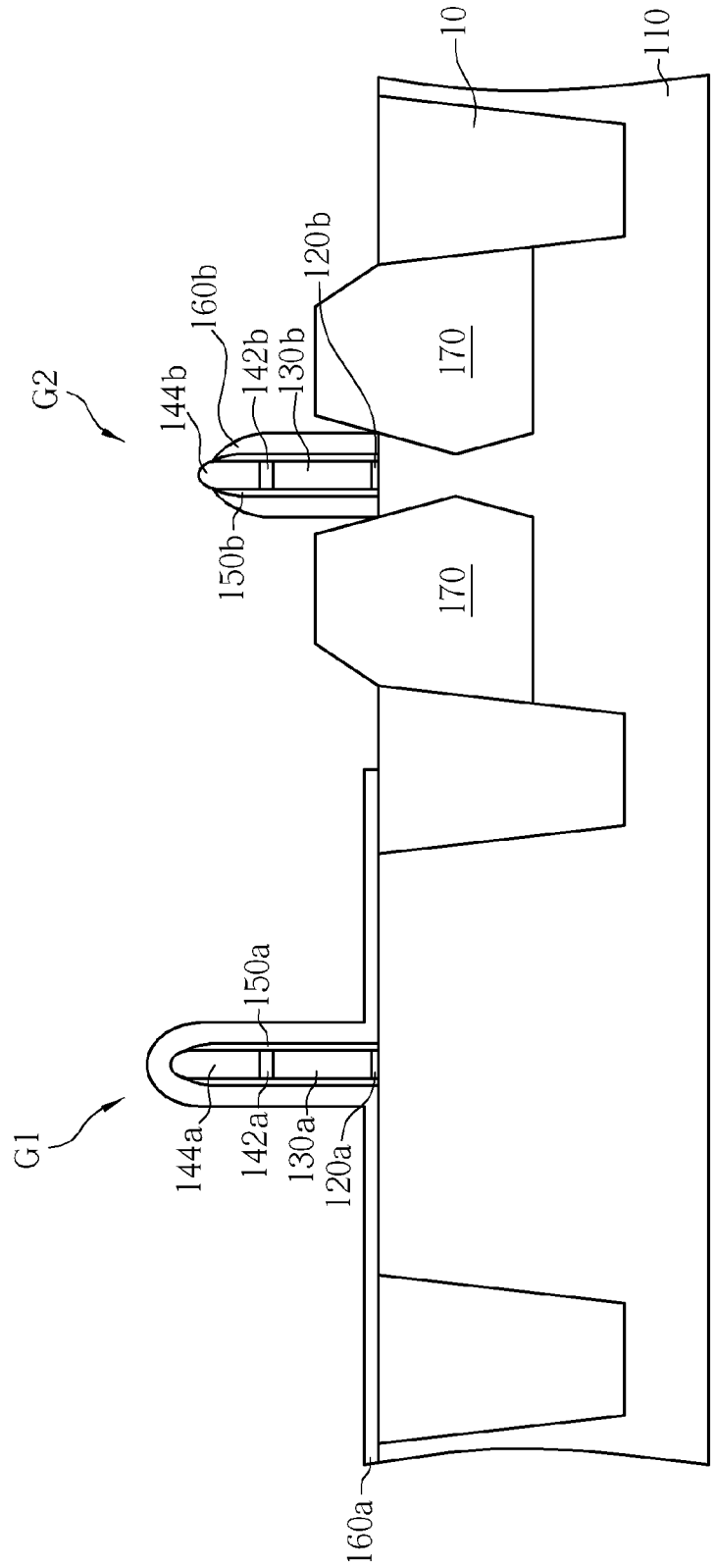

As shown in FIG. 5, an epitaxial layer 170 is formed in the recess R. In this embodiment, the epitaxial layer 170 may include a silicon germanium epitaxial layer suited for forming a PMOS transistor; in this case the first gate G1 is a gate of an NMOS transistor. Reciprocally, when the epitaxial layer 170 includes a silicon carbide epitaxial layer, the second gate G2 is a gate of an NMOS transistor and the first gate G1 is a gate of a PMOS transistor.

Figure 6:
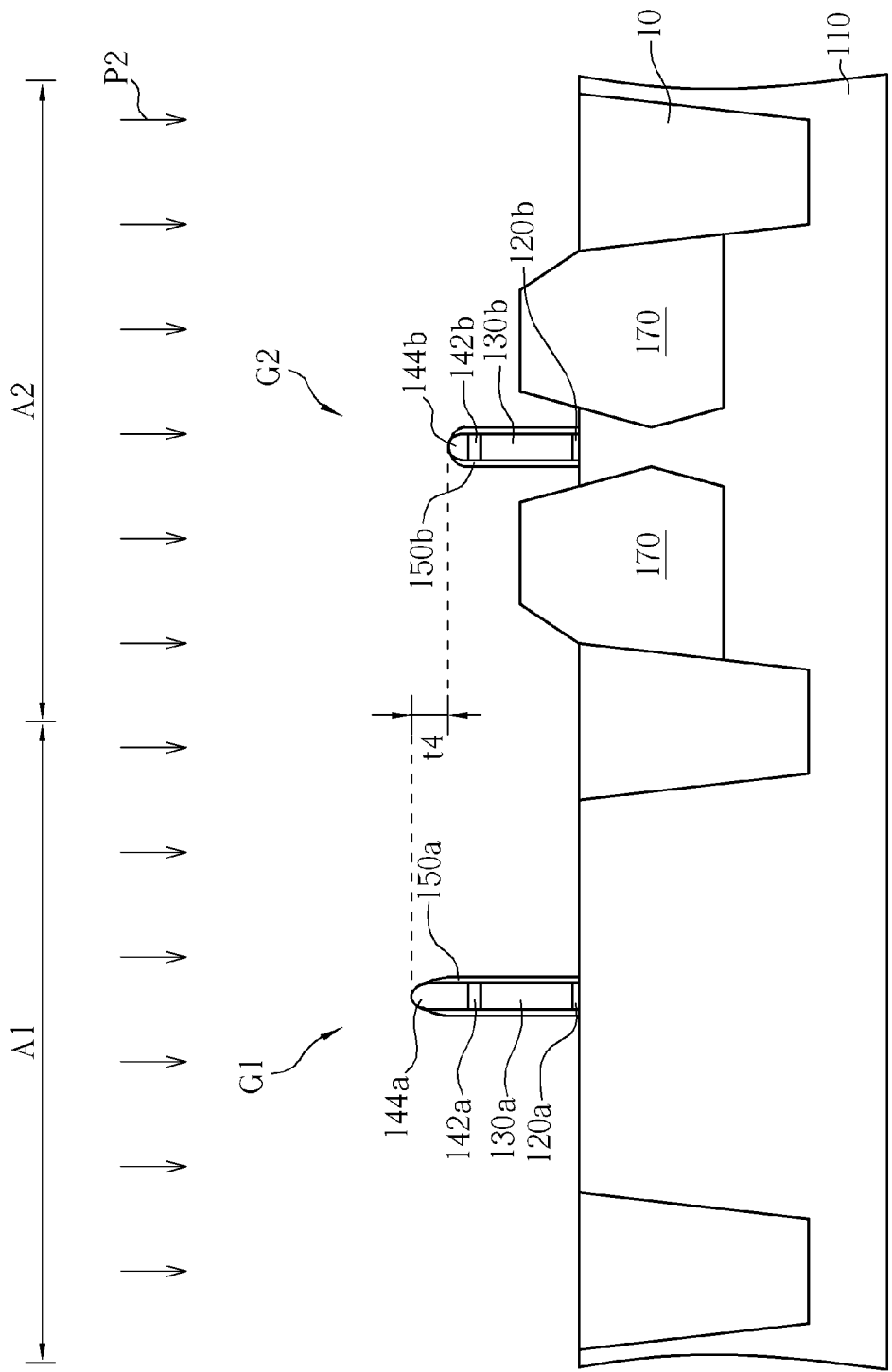

As shown in FIG. 6, an etching process P2 without using a hard mask is performed on the whole substrate 110, to entirely remove the hard mask layer 160a remaining and the first spacer 160b. The etching process P2 includes a wet etching process, such as a phosphoric acid containing wet etching process. The materials of the second cap layer 144b and the hard mask layer 160 in the present invention are different, such as selecting the materials of the etching process P2 of the second cap layer 144b having a lower etching rate than that of the hard mask layer 160, in order to remove the remaining hard mask layer 160a and the first spacer 160b entirely. As the etching process P2 is performed, the second gate G2 is partly etched, resulting in the thickness difference t4 between the first gate G1 and the second gate G2 being larger than the first thickness difference t3.

It is emphasized that the remaining hard mask layer 160*a* and the first spacer 160*b* are entirely removed (without the first spacer 160*b* residues), for they could cause the following formed second spacer to have inaccurate width, the etching to produce notches, an over-etching of the second cap layer 144*b* or exposure of the second gate layer 130*b*. They are removed by applying a material of the hard mask layer 160 different from the materials of the second cap layer 144*b*. In the present invention, they are removed by applying the material of the hard mask layer 160 with an etching rate of the lithography process P1 or of the etching process P2 larger than that of the material of the second cap layer 144*b* for example. In this embodiment, the first cap layer 144*a* and the second cap layer 144*b* are formed by the cap layer 144' therefore both materials are the same. In another embodiment, the materials of the first cap layer 144*a* and the second cap layer 144*b* may be different. The first spacer 160*b* may be entirely removed by carefully selecting the material of the second cap layer 144*b*.

Figure 7:
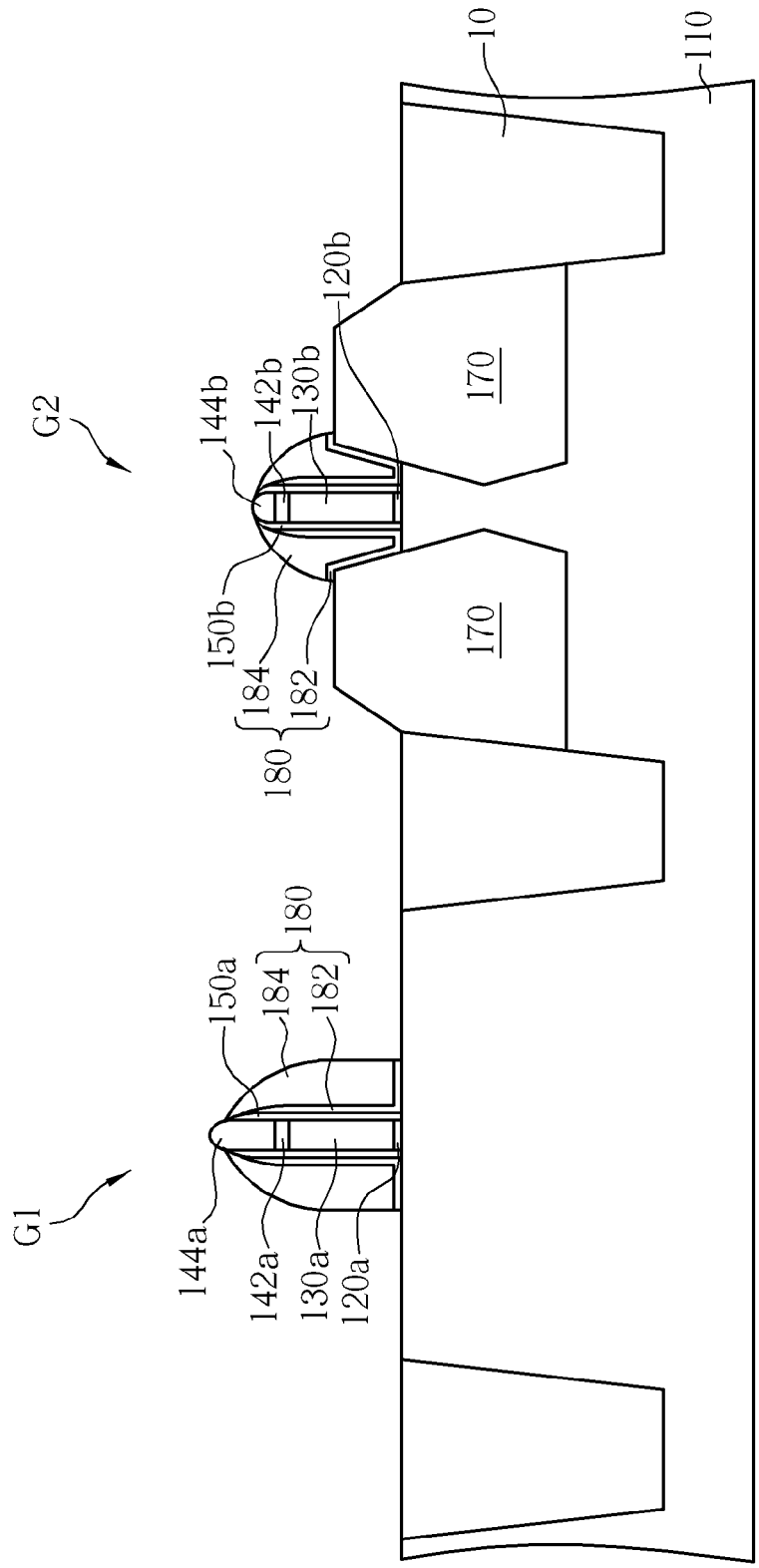

In this embodiment, the thickness of the third cap layer 142*a* is preferably lower than that of the first cap layer 144*a*, and the thickness of the fourth cap layer 142*a* is preferably lower than that of the second cap layer 144*a*. In a preferred embodiment, the thickness of the third cap layer 142*a* or the fourth cap layer 142*a* may be 200 angstroms, while the thickness of the first cap layer 144*a* or the second cap layer 144*b* may be 650 angstroms; or, the thickness of the third cap layer 142*a* or the fourth cap layer 142*a* may be 100 angstroms, while the thickness of the first cap layer 144*a* or the second cap layer 144*b* may be 750 angstroms. This way, the first cap layer 144*a* and the second cap layer 144*b* will not be depleted during patterning. Thus, the first cap layer 144*a* or the second cap layer 144*b* can avoid the first gate layer 130*a* and the second gate layer 130*b* from being exposed as the lithography process P1 or the etching process P2 is performed, which could degrade the electrical performance of the gates, As shown in FIG. 7, a second spacer 180 is formed beside the first gate G1 and the second gate G2 respectively. The second spacer 180 may include an oxide layer 182 located outside first gate G1 and the second gate G2, and a nitride layer 184 located outside the oxide layer 182, but it is not limited thereto. Anion implantation process may be performed to form a source/drain (not shown) in the substrate 110 beside the first gate G1 and the second gate G2 respectively.

Figure 8:
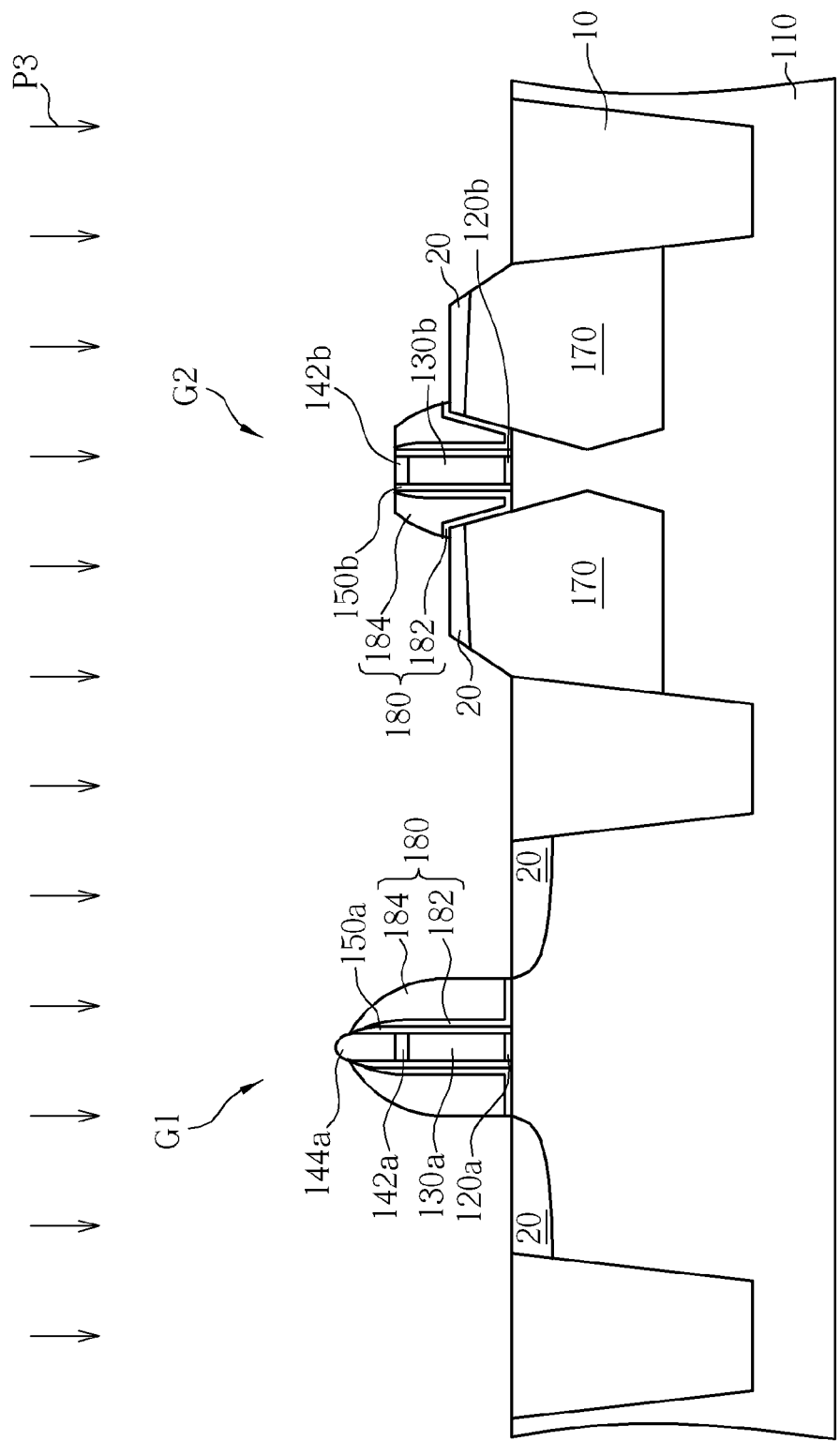

As shown in FIG. 8, a cleaning process P3 may be performed to clean the surfaces of the first gate G1, the second gate G2 and the substrate 110, after the second spacer 180, the source/drain are formed beside the first gate G1 and the second gate G2. As the cleaning process P3 is performed, the second cap layer 144*b* is removed. The cleaning process P3 may include a pre-cleaning process for forming salicide, such as an ammonia ($NH_3$) and nitrogen trifluoride ($NF_3$) containing cleaning process. For example, the reaction of the ammonia ($NH_3$) and nitrogen trifluoride ($NF_3$) containing cleaning process may be:

(1) plasma reaction of the gas mixture:

(2) etching (performed at a temperature of 30° C.)

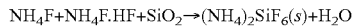

(3) sublimation (performed at a temperature higher than 100° C.)

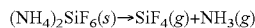

After the cleaning process P3 is performed, a salicide process may be performed to form a salicide layer 20 in the substrate 110.

Figure 9:
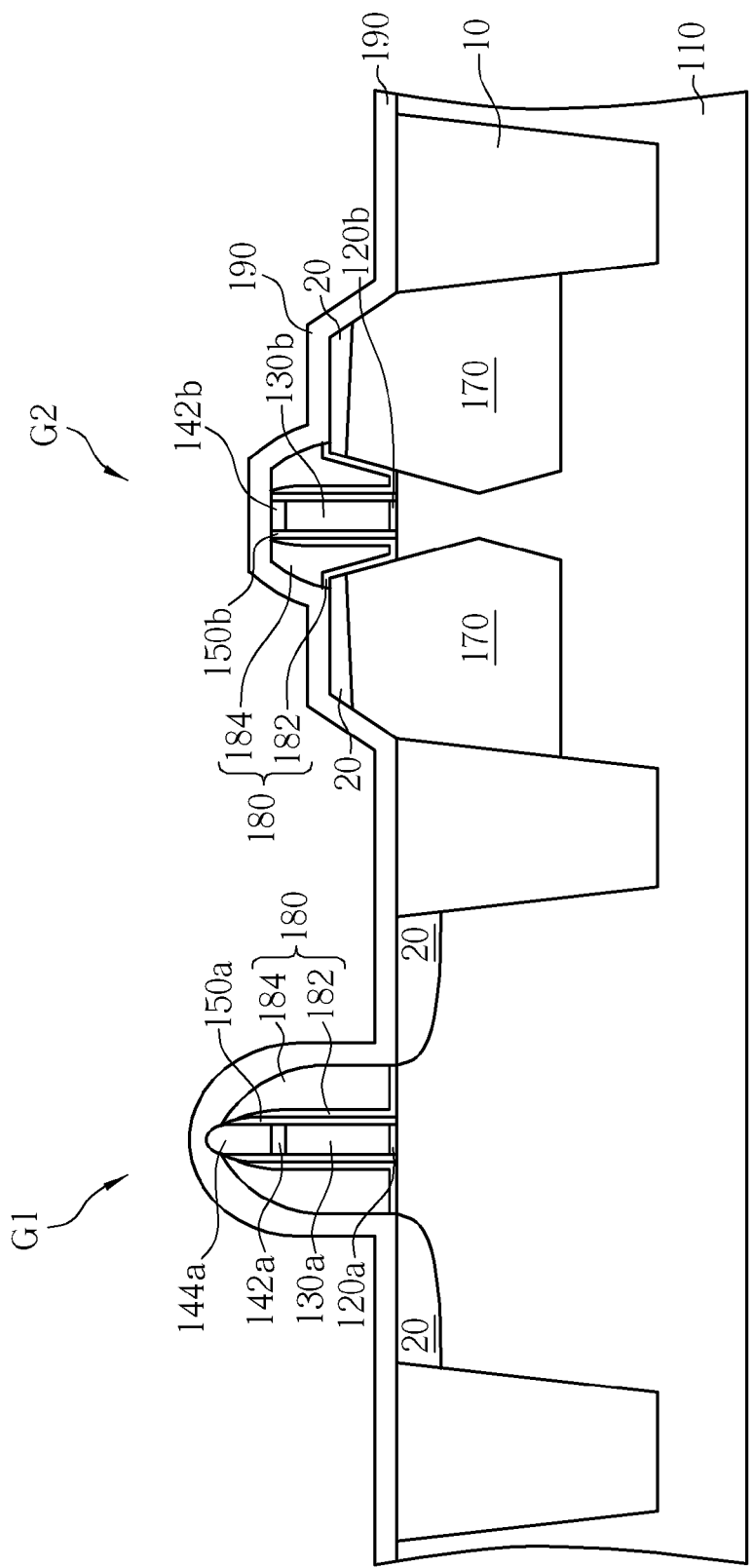

AS shown in FIG. 9, a protective layer 190 may be selectively formed to entirely cover the first gate G1 and the second gate G2. In this embodiment, the material of the protective layer 190 is preferably the same as the material of the second spacer 180, the third cap layer 142*a* and the fourth cap layer 142*b*, such as a silicon nitride, for being removed together with the nitride layer 184 of the second spacer 180, the third cap layer 142*a* and the fourth cap layer 142*b*, but it is not restricted thereto.

Figure 10:
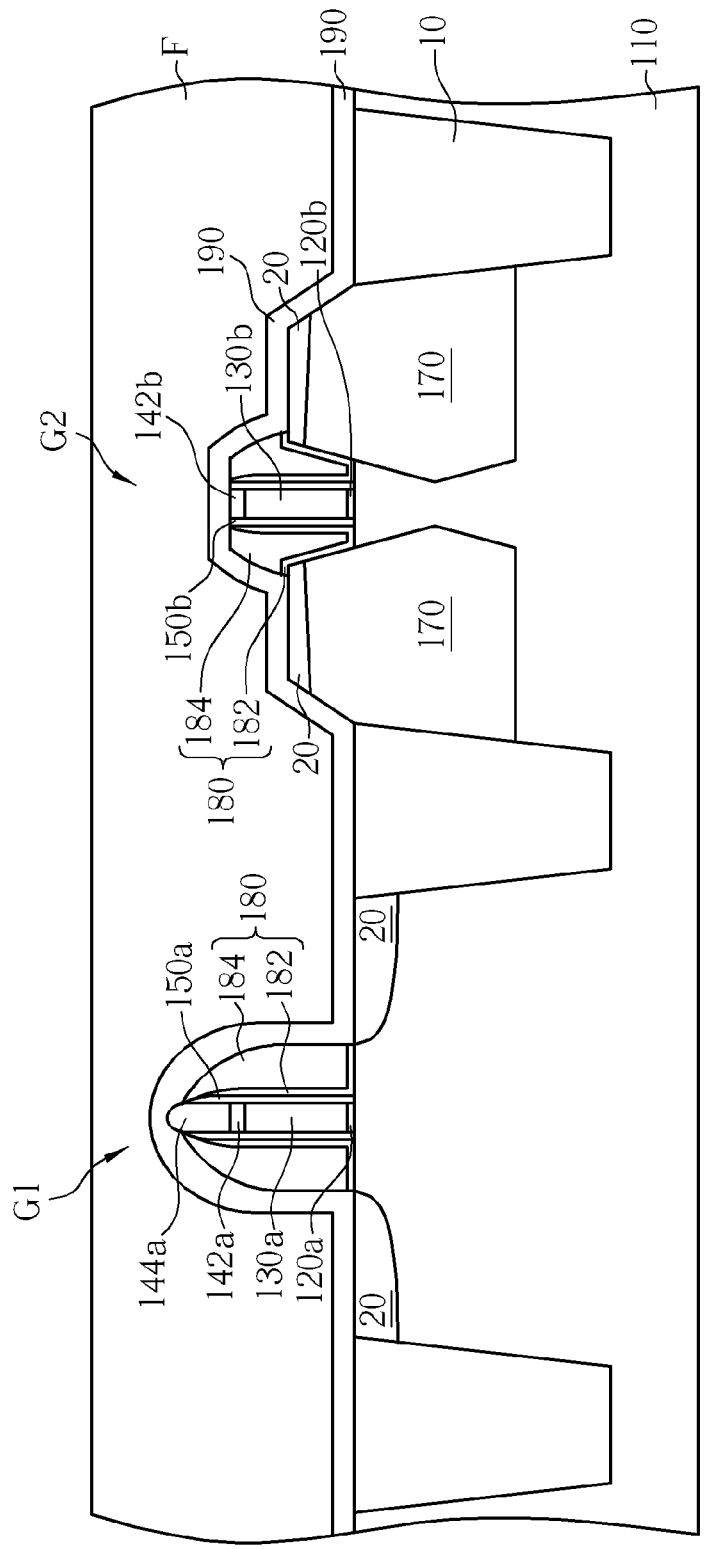

As shown in FIG. 10, a material layer F is formed to entirely cover the first gate G1 and the second gate G2. The material layer F may be a photoresist layer.

Figure 11:
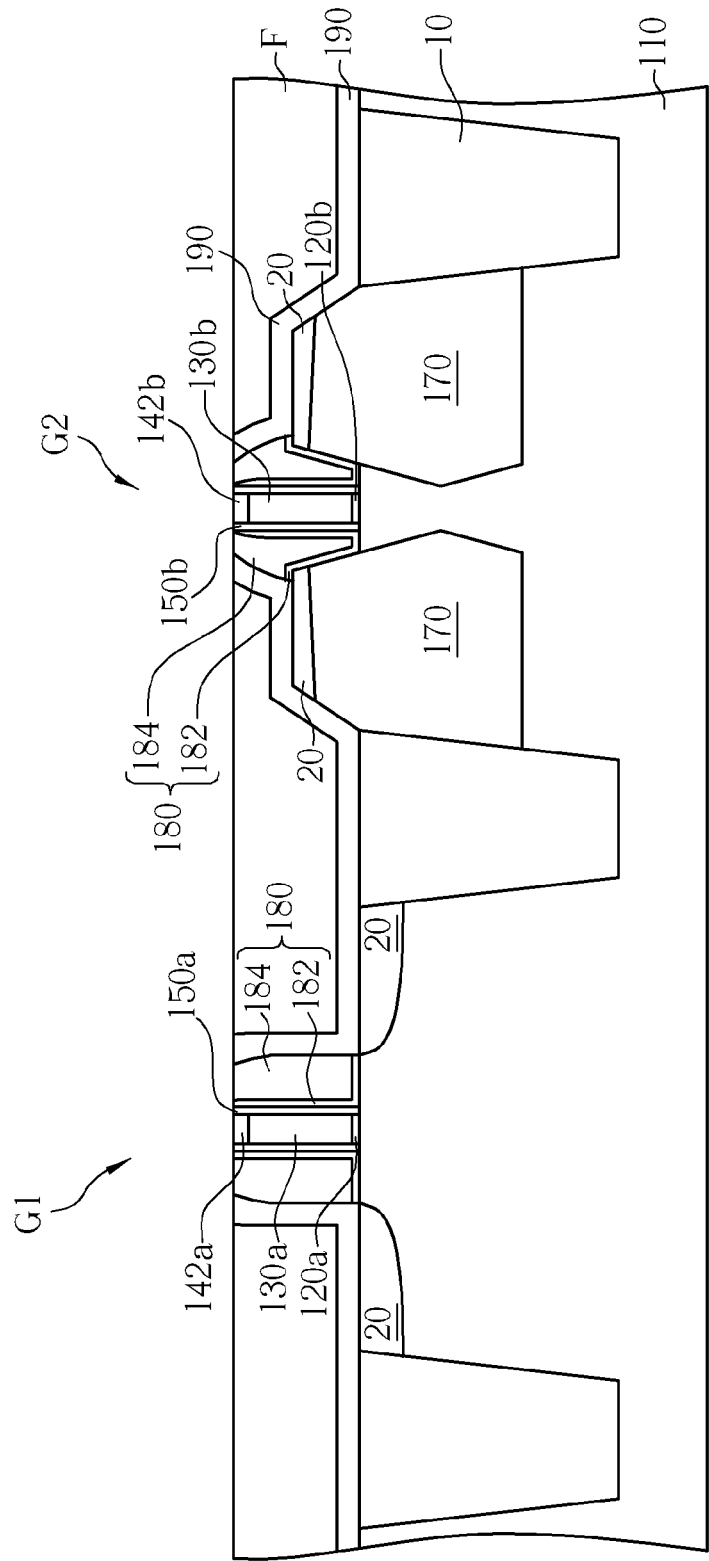

As shown in FIG. 11, parts of the material layer F, parts of the protective layer 190, parts of the first gate G1 and parts of the second gate G2 are etched back until the third cap layer 142*a* and the fourth cap layer 142*b* are exposed. At this time, the first cap layer 144*a* above the first gate G1 is removed. The method of etching back may include performing an oxygen or fluorine containing dry etching process such as an oxygen plasma dry etching process, but it is not limited thereto.

Figure 12:
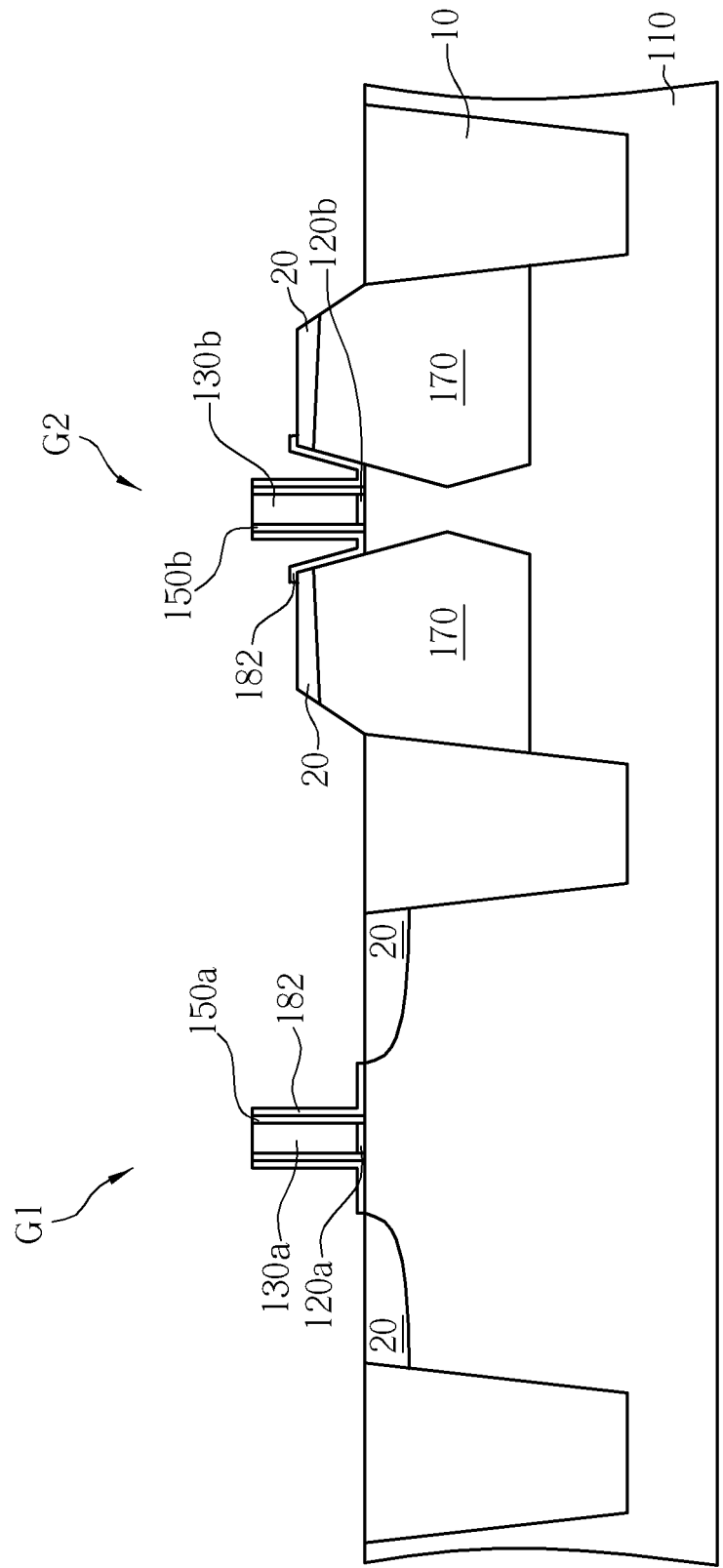

As shown in FIG. 12, the material layer F remaining, the third cap layer 142*a*, the fourth cap layer 142*b* and the nitride layer 184 of the second spacer 180 are sequentially removed. Due to the protective layer 190 in this embodiment being a silicon nitride layer (the same as the materials of the nitride layer 184, the third cap layer 142*a* and the fourth cap layer 142*b*), it will be removed together with the nitride layer 184, the third cap layer 142*a* can and the fourth cap layer 142*b*.

Figure 13:
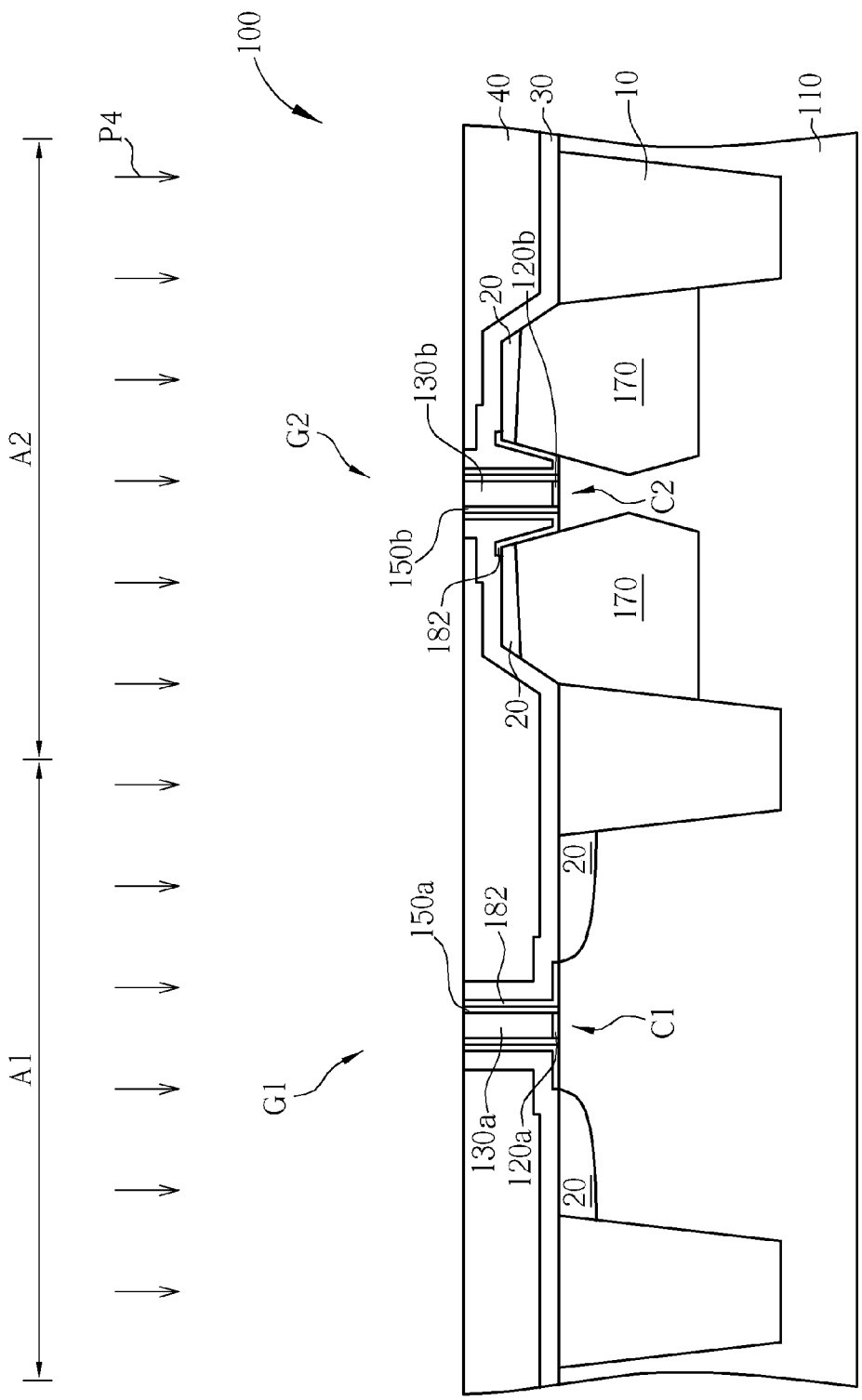

As shown in FIG. 13, a contact etch stop layer 30 (CESL) is formed to entirely cover the first gate G1 and the second gate G2, wherein the materials of the contact etch stop layer 30 covering the first gate G1 and the second gate G2 may be different, therefore transistors formed by the first gate G1 and the second gate G2 (the first gate G1 may be used to form a PMOS transistor and the second gate G2 may be used to form an NMOS transistor) can be forced with different stresses. The contact etch stop layer 30 may be a single layer contact etch stop layer or a dual contact etch stop layer etc. An interdielectric layer 40 is formed to cover the contact etch stop layer 30. A planarization process P4 such as a chemical mechanical polishing (CMP) process is performed to planarize parts of the interdielectric layer 40 and parts of the contact etch stop layer 30, until the first gate layer 130*a* and the second gate layer 130*b* are exposed. The contact etch stop layer 30 may include a doped silicon nitride layer, which can force gate channels C1 and C2 with stresses; the interdielectric layer 40 may be an oxide layer, but is not limited thereto. Since the material layer F is formed and etched back to make the first gate G1 and the second gate G2 have the same height, parts of the interdielectric layer 40 and parts of the contact etch stop layer 30 can be planarized uniformly by the planarization process P4. Therefore, the electrical performance and the processing yields of the semiconductor structure 100 being planarized can be improved.

Some semiconductor processes performed in the following steps, such as removing the first gate layer 130*a* and the second gate layer 130*b*, sequentially filling a barrier layer, a work function metal layer and a main metal electrode layer, etc, are known in the art and are not described herein.

Figure 14:
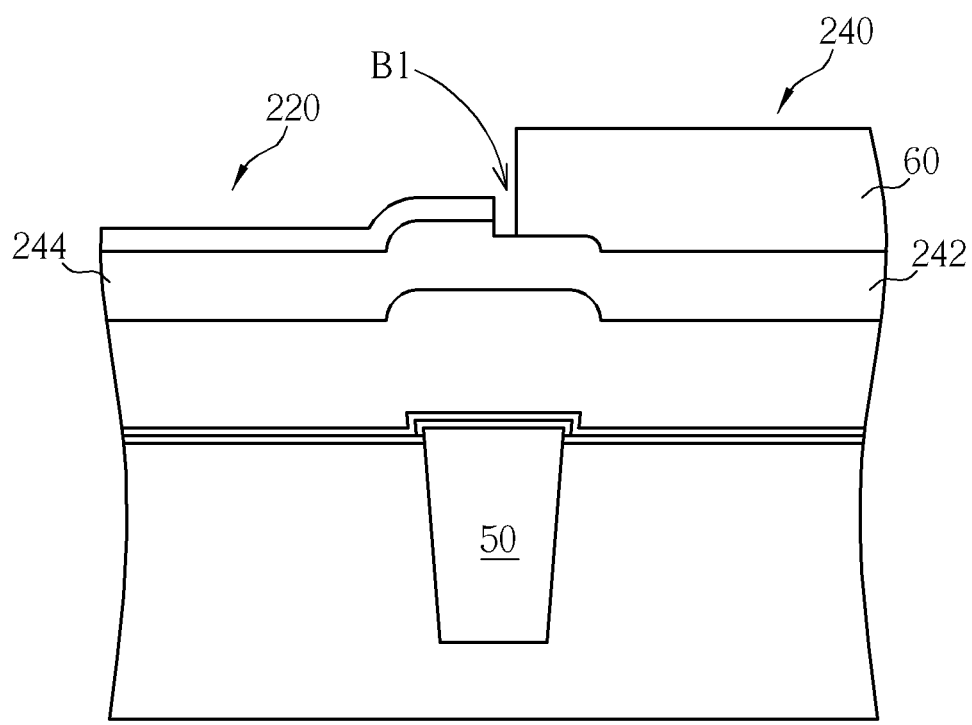
FIGS. 14-15 schematically depict a cross-sectional view of a static random access memory (SRAM) according to one embodiment.
Figure 15:
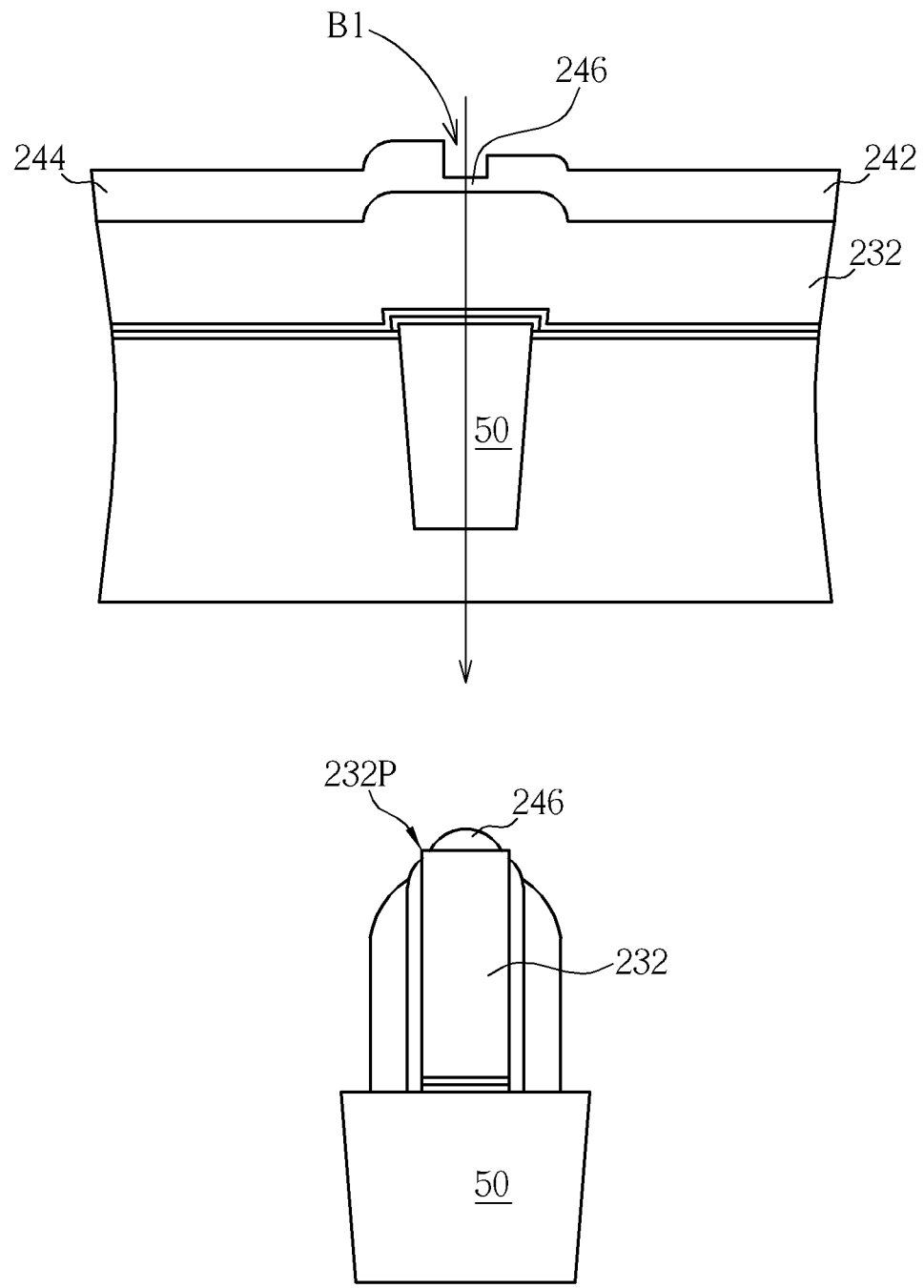

The present invention can also be applied to other semiconductor processes. FIGS. 14-15 schematically depict a cross-sectional view of a static random access memory (SRAM) according to one embodiment. FIGS. 16-19 schematically depict a cross-sectional view of a static random access memory (SRAM) according to another embodiment.

As shown in FIG. 14, an isolation structure 50, such as a shallow trench isolation structure, is located between an NMOS transistor 220 and a PMOS transistor 240. After an epitaxial layer (not shown) is formed in the PMOS transistor 240, the thickness of a cap layer 242 of the PMOS transistor 240 is lower than the thickness of a cap layer 244 of the NMOS transistor 220. Therefore, a lithography process is additionally performed to thin the cap layer 244. However, a photoresist layer 60 formed during the lithography process may be misaligned. If the photoresist layer 60 is shifted to the right, a boundary area B1 will be etched duplicately. As shown in FIG. 15, the thickness of a cap layer 246 in the boundary area B1 is therefore lower than the thickness of the cap layers 242 and 244, so an upper part 232p of a gate layer 232 may be exposed. The upper part 232p being exposed will have salicide formed thereon in following processes, leading to the gate layer 232 being harder to remove or gate layers 232 electrically connecting to each other, giving rise to short circuits.

Figure 16:
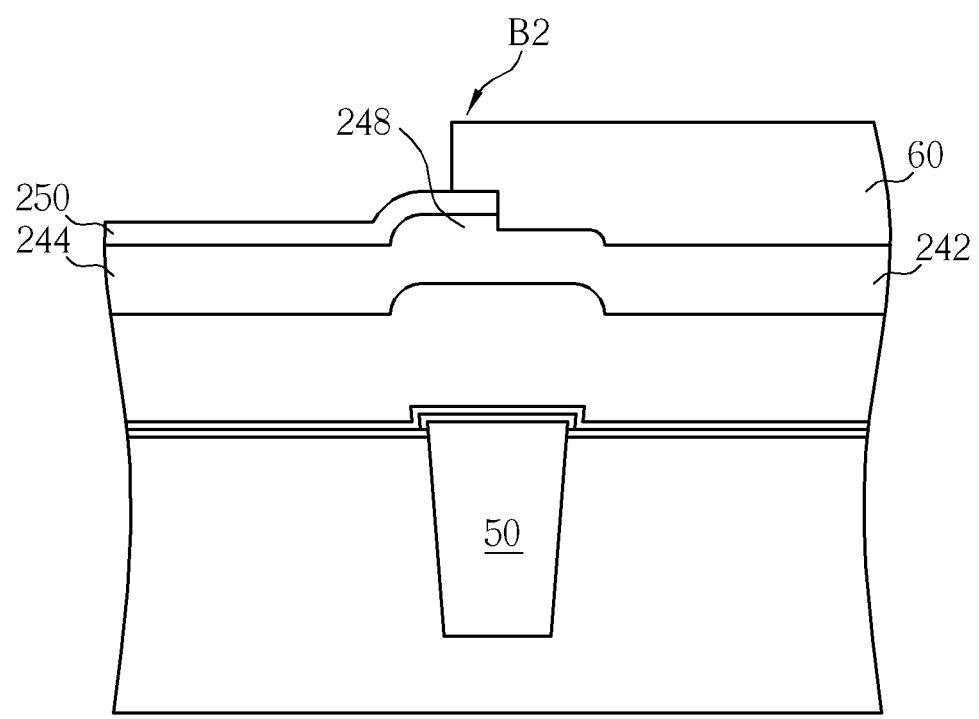
FIGS. 16-19 schematically depict a cross-sectional view of a static random access memory (SRAM) according to another embodiment.
Figure 17:
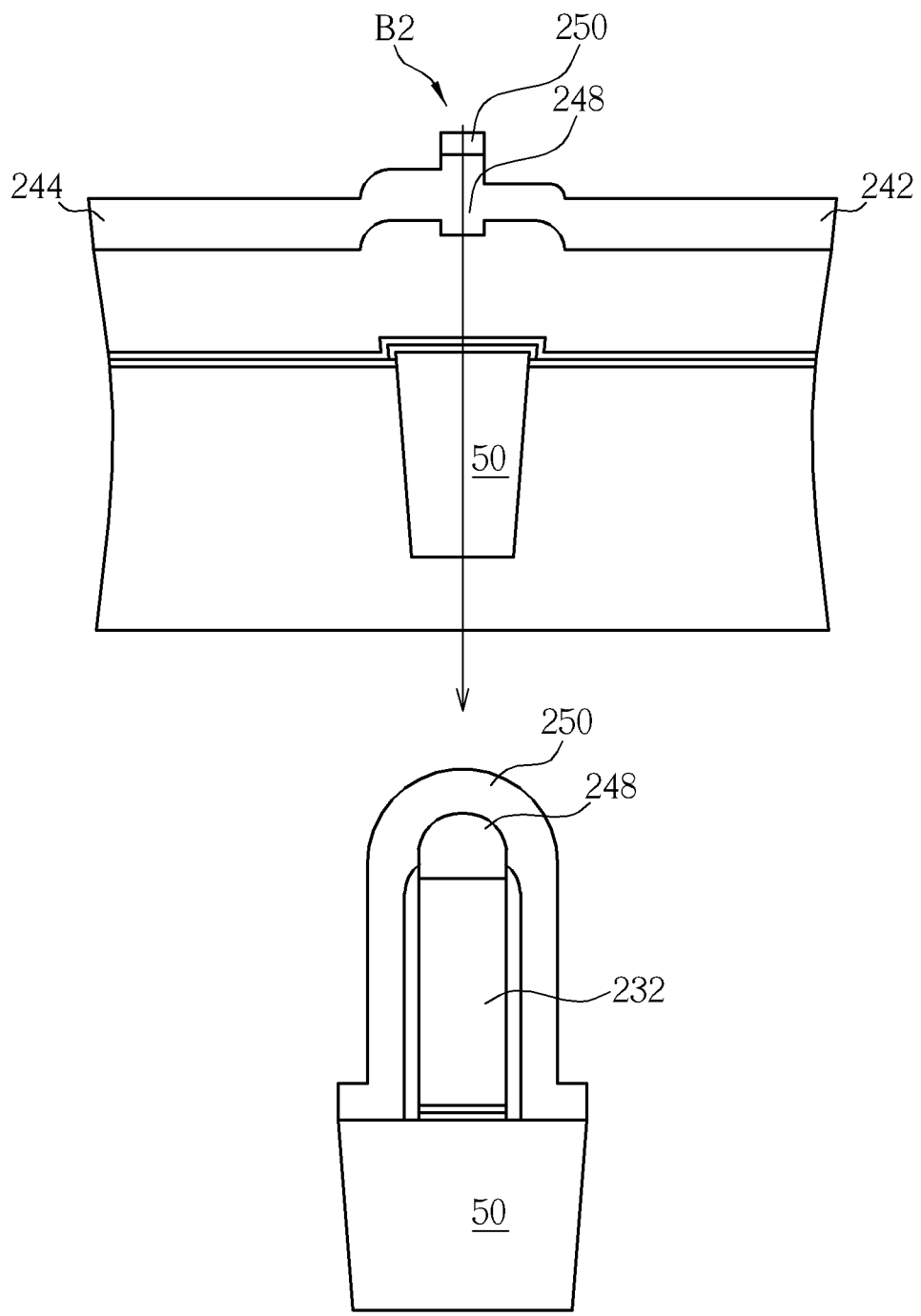
Figure 18:
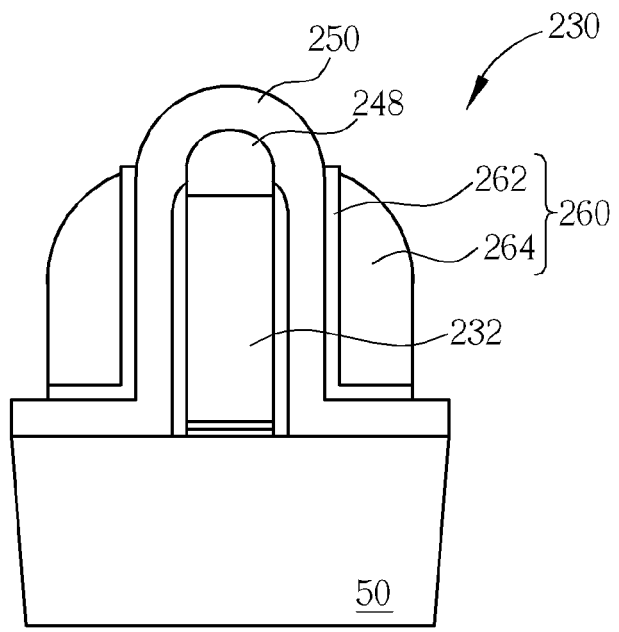
Figure 19:
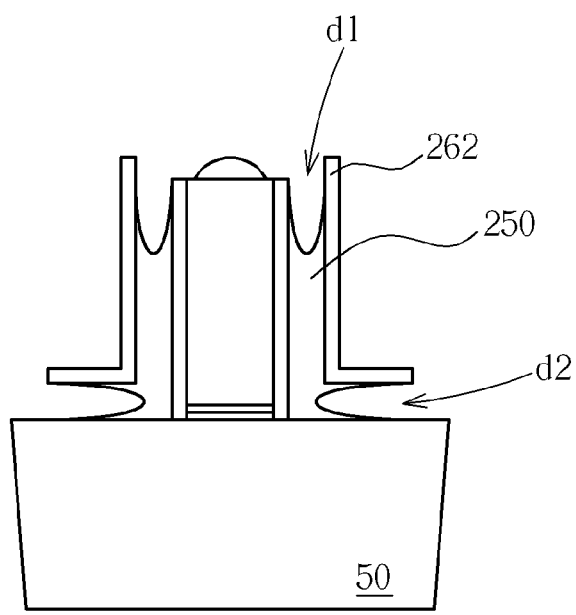

As shown in FIG. 16, if the photoresist layer 60 is shifted to the left, the misalignment of the photoresist layer 60 formed during the lithography process may lead to a cap layer 248 and a hard mask layer 250 not being etched because of the photoresist layer 60 covering them. As shown in FIG. 17, the thickness of the cap layer 248 in a boundary B2 is therefore larger than the thicknesses of the cap layers 242 and 244, and the hard mask layer 250 for forming the epitaxial layer (not shown) remains on the cap layer 248. As shown in FIG. 18, a second spacer 260, that should be formed on a gate 230, is formed on the hard mask layer 250 because of the hard mask layer 250 residues, wherein the second spacer 260 may include an oxide layer 262 located outside of the hard mask layer 250, and a nitride layer 264 located outside of the oxide layer 262. As shown in FIG. 19, as the second spacer 260 is removed, part of the hard mask layer 250 not covered by the oxide layer 262 will be etched, which causes notches d1 and d2, and reduces the electrical performances of the static random access memory (SRAM).

Accordingly, the present invention can solve the problem of misalignment in the boundary caused by a lithography process performed twice. Similarly to FIG. 6, an etching process is performed to entirely etch the substrate 110, without using a mask. In the present invention, a material for the hard mask layer 250 is a silicon nitride layer, which is different from the materials of the cap layer 242 and the cap layer 244. Therefore, the static random access memory (SRAM) utilizing the semiconductor process of the present invention will not have said notches d1 and d2, because the hard mask layer 250 can be removed entirely by applying the etching process once.

In summary, the present invention provides the semiconductor process, which forms the cap layer with a material different from the hard mask layer on the gate, so that the hard mask layer (and the spacer formed by the hard mask) can be removed entirely without the cap layer being over-etched, and the gate layer below being exposed. Thus, the present invention can enhance the efficiency of the contact etch stop layer formed on the gate. Besides, the hard mask layer can be entirely removed by performing the lithography process once in the present invention, so that the boundary misalignment of the static random access memory (SRAM) can be avoided.

Moreover, the plurality of the cap layers of the gates having different thicknesses can be removed uniformly in the present invention by the method of forming and etching back the material layer. Thus, the gates have the same thicknesses and the interdielectric layer and the contact etch stop layer can be planarized uniformly, until the gate layers are exposed by a planarization process, thereby improving the electrical performances of the semiconductor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
    forming a first gate and a second gate on a substrate, wherein the first gate comprises a first gate layer located on the substrate and a first cap layer located on the first gate layer, and the second gate comprises a second gate layer located on the substrate and a second cap layer located on the second gate layer;
    forming a hard mask layer to cover the first gate and the second gate, wherein the material of the hard mask layer and the materials of the first cap layer and the second cap layer are different;
    performing a lithography process for patterning the hard mask layer located on the second gate to form a first spacer beside the second gate and forming a recess in the substrate beside the first spacer;
    forming an epitaxial layer in the recess;
    performing an etching process to remove the hard mask layer remaining and the first spacer entirely; and
    forming a second spacer beside the first gate and the second gate respectively.

2. The semiconductor process according to claim 1, wherein the steps of forming the first gate and the second gate on the substrate comprise:
    forming a gate layer on the substrate;
    forming a cap layer on the gate layer; and
    sequentially patterning the cap layer and the gate layer to form the first gate and the second gate on the substrate.

3. The semiconductor process according to claim 1, wherein the etching rate of the lithography process of the second cap layer is lower than the etching rate of the lithography process of the hard mask layer.

4. The semiconductor process according to claim 1, wherein the etching rate of the etching process to the second cap layer is lower than the etching rate of the etching process to the hard mask layer.

5. The semiconductor process according to claim 1, wherein the hard mask layer on the top of the second gate is removed, therefore exposing the second gate as the lithography process is performed.

6. The semiconductor process according to claim 5, wherein the second gate is partially etched, resulting in the thickness of the first gate being larger than the thickness of the second gate, the thickness difference between the first gate and the second gate being a first thickness difference, as the lithography process is performed.

7. The semiconductor process according to claim 6, wherein the second gate is partially etched, resulting in the thickness difference between the first gate and the second gate being larger than the first thickness difference as the etching process is performed.

8. The semiconductor process according to claim 1, wherein the first cap layer comprises a first oxide layer located on the first gate layer, and the second cap layer comprises a second oxide layer located on the second gate layer.

9. The semiconductor process according to claim 8, further comprising a first nitride layer located between the first oxide layer and the first gate layer, and a second nitride layer located between the second oxide layer and the second gate layer, wherein the thickness of the first nitride layer is lower than the thickness of the first oxide layer, and the thickness of the second nitride layer is lower than the thickness of the second oxide layer.

10. The semiconductor process according to claim 9, wherein the thicknesses of the first nitride layer and the second nitride layer are 200 angstroms and the thicknesses of the first oxide layer and the second oxide layer are 650 angstroms.

11. The semiconductor process according to claim 9, wherein the thicknesses of the first nitride layer and the second nitride layer are 100 angstroms and the thicknesses of the first oxide layer and the second oxide layer are 750 angstroms.

12. The semiconductor process according to claim 8, further comprising performing a cleaning process to clean the surfaces of the first gate, the second gate and the substrate, and remove the second oxide layer simultaneously after the second spacer is formed beside the first gate and the second gate.

13. The semiconductor process according to claim 12, wherein the cleaning process comprises a pre-cleaning process for forming a salicide.

14. The semiconductor process according to claim 13, wherein the cleaning process comprises an ammonia (NH3) and nitrogen trifluoride (NF3) containing cleaning process.

15. The semiconductor process according to claim 1, wherein the etching process comprises a phosphoric acid containing wet etching process.

16. A semiconductor process, comprising:
providing a substrate;
forming a first gate and a second gate on the substrate, wherein the first gate comprises a first gate layer located on the substrate, a first nitride layer located on the first gate layer and a first oxide layer located on the first nitride layer, and the second gate comprises a second gate layer located on the substrate and a second nitride layer located on the second gate layer;
forming a material layer comprising a photoresist layer to entirely cover the first gate and the second gate after the first gate and the second gate are formed; and
etching back the material layer, the first gate and the second gate until the first nitride layer and the second nitride layer are exposed, wherein the method of etching back comprises performing an oxygen or fluorine containing dry etching process.

17. The semiconductor process according to claim 16, further comprising forming a protective layer to entirely cover the first gate and the second gate before the material layer is formed.

18. The semiconductor process according to claim 16, wherein the first oxide layer is removed as the material layer, the first gate and the second gate are etched back, until the first nitride layer and the second nitride layer is exposed.

19. The semiconductor process according to claim 16, further comprising forming a second spacer beside the first gate and the second gate respectively after the substrate is provided, and after the material layer, the first gate and the second gate are etched back, further comprising:
sequentially removing the material layer remaining and the second spacer;
forming a contact etch stop layer to entirely cover the first gate and the second gate;
forming an interdielectric layer to cover the contact etch stop layer; and
planarizing parts of the interdielectric layer and parts of the contact etch stop layer until the first gate layer and the second gate layer are exposed.

\* \* \* \* \*